(12) United States Patent
Drenth

(10) Patent No.: US 10,296,706 B2
(45) Date of Patent: May 21, 2019

(54) METHOD AND SYSTEM FOR CONTROL AND CO-SIMULATION OF PHYSICAL SYSTEMS

(71) Applicant: VOLVO CAR CORPORATION, Gothenburg (SE)

(72) Inventor: Edo Drenth, Helsingborg (SE)

(73) Assignee: Volvo Car Corporation, Gothenburg (SE)

( * ) Notice: Subject to any disclaimer, the term of this patent is extended or adjusted under 35 U.S.C. 154(b) by 323 days.

(21) Appl. No.: 15/232,261

(22) Filed: Aug. 9, 2016

(65) Prior Publication Data
US 2017/0061069 A1 Mar. 2, 2017

(30) Foreign Application Priority Data
Aug. 25, 2015 (EP) ..................................... 15182298

(51) Int. Cl.
*G06G 7/48* (2006.01)
*G06F 17/50* (2006.01)
(Continued)

(52) U.S. Cl.
CPC ..... *G06F 17/5095* (2013.01); *F02D 41/1401* (2013.01); *G06F 17/5009* (2013.01);
(Continued)

(58) Field of Classification Search
None
See application file for complete search history.

(56) References Cited

U.S. PATENT DOCUMENTS

| 7,606,655 B2 | 10/2009 | Husted et al. |
| 2006/0117834 A1 | 6/2006 | Goto |

(Continued)

FOREIGN PATENT DOCUMENTS

| EP | 1905989 A2 | 4/2008 |
| EP | 2442248 A1 | 4/2012 |
| EP | 2680157 A1 | 1/2014 |

OTHER PUBLICATIONS

Edwards, Timothy S., "Effects of Aliasing on Numerical Integration", Sep. 23, 2005, Mechanical Systems and Signal Processing 21, Elsevier Ltd. (Year: 2005).*

(Continued)

*Primary Examiner* — Cedric Johnson
(74) *Attorney, Agent, or Firm* — Brooks Kushman P.C.

(57) ABSTRACT

A method for control and co-simulation in a system having multiple subsystems, each representing a physical system, includes, in a first subsystem simulating a first physical system, providing a first time continuous output signal representing a property of the first physical system, and filtering the output signal using a continuous moving average (CMA) filter as an anti-aliasing filter to form a filtered time continuous signal. Filtering the output signal includes integrating the time continuous signal to form an integrated signal, sampling the integrated signal, for each sample, forming an average value from the current sample and a previous sample, and forming a filtered time continuous signal from the average values. The method also includes providing the filtered time continuous signal to a second subsystem simulating a second physical system. A system for performing the method is also provided.

14 Claims, 10 Drawing Sheets

(51) Int. Cl.
  *F02D 41/14* (2006.01)
  *F02D 41/28* (2006.01)
(52) U.S. Cl.
  CPC .............. *F02D 2041/1432* (2013.01); *F02D 2041/1433* (2013.01); *F02D 2041/1437* (2013.01); *F02D 2041/288* (2013.01); *F02D 2250/14* (2013.01)

(56) References Cited

U.S. PATENT DOCUMENTS

| | | | |
|---|---|---|---|
| 2006/0206254 | A1 | 9/2006 | Remelman |
| 2009/0118989 | A1 | 5/2009 | Padhi et al. |
| 2010/0010724 | A1 | 1/2010 | Tripathi et al. |
| 2010/0063786 | A1* | 3/2010 | Harke .............. G06F 17/5022 703/6 |
| 2011/0040818 | A1* | 2/2011 | Fagg ................. H03H 15/023 708/313 |
| 2014/0251272 | A1* | 9/2014 | Moonjelly ............ F02M 65/00 123/435 |

OTHER PUBLICATIONS

Sicklinger, Interface-Jacobian Based Co-Simulation, Proceedings of conference Coupled Problems, Jun. 17, 2013, Ibiza, Spain. <http://www.congress.cimne.com/coupled2013/proceedings/pdfs/a869.pdf>.

Blochwitz, Functional Mockup Interface 2.0: The Standard for Tool Independent Exchange of Simulation Models, Proceedings of the 9th International Modelica Conference, Sep. 3, 2012, Munich, Germany. <http://www.modelica.org/projects>.

Extended European Search Report and Written Opinion for related European application No. EP15182298, dated Feb. 2, 2016, 10 pp.

Smith, Chapter 15: Moving Average Filters, The Scientist's and Engineer's Guide to Digital Signal Processing, dated Jan. 1, 1999, California Technical Publishing, XP055351355, pp. 277-284.

European Patent Office, Extended European Search Report for Application No. EP15194478.2-1954, dated Mar. 17, 2017, 9 pages.

European Patent Office, Extended European Search Report for Application No. EP15191048.6-1954, dated Mar. 10, 2017, 10 pages.

European Patent Office, Transmittal of Third-Party Observations to Applicant for Application No. EP15182298.8, dated Mar. 28, 2018, 88 pages.

Benedikt et al., NEPCE—A Nearly Energy-Preserving Coupling Element for Weak-Coupled Problems and Co-Simulations (2013), V International Conference on Computational Methods for Coupled Problems in Science and Engineering, 12 pages (Part of Third-Party Observation to Applicant, Exhibit 1).

Benedikt et al., A Nearly Energy-Preserving Coupling Element for Holistic Weak-Coupled System Co-Simulations, Presented at NAFEMS World Congress 2013, Virtual Vehicle Research Center, Austria and Institute of Automation and Control, Graz University of Technology, Austria, 18 pages (Part of Third-Party Observation to Applicant, Exhibit 3).

Scharff et al., A Simple Process for Balance Correction in Co-Simulation Environments (Title and Abstract only, machine-translated), © VDI Wissensforum 2012, Veranstaltungsunterlagen, 16 pages (Part of Third-Party Observation to Applicant, Exhibit 4).

Benedikt et al., Modern Coupling Strategies—Is Co-Simulation Controllable?, NAFEMS SEMINAR: The Role of CAE in System Simulation, Nov. 8-9, 2011, Wiesbaden, Germany, 10 pages (Part of Third-Party Observation to Applicant, Exhibit 5).

Benedikt et al., Guidelines for the Application of a Coupling Method for Non-Iterative Co-Simulation, 2013 8th Eurosim Congress on Modelling and Simulation, IEEE, Sep. 10, 2013, pp. 244-249, XP032719461, (Part of Third-Party Observation to Applicant, Exhibit 6).

* cited by examiner

METHOD AND SYSTEM FOR CONTROL AND CO-SIMULATION OF PHYSICAL SYSTEMS

CROSS-REFERENCE TO RELATED APPLICATIONS

This application claims foreign priority benefits under 35 U.S.C. § 119(a)-(d) to European patent application number EP 15182298.8, filed Aug. 25, 2015, which is incorporated by reference in its entirety.

TECHNICAL FIELD

The present disclosure relates to a system and method for control and co-simulation of a physical system. In particular, the present disclosure relates to the connection of subsystems in a control or co-simulation system.

BACKGROUND

The automotive industry is increasing its pace in product development. At the same time an increasing number of mechatronic systems are deployed in the final product. These systems are developed virtually and have to be integrated in purpose driven integration platforms with purpose driven fidelity simulation models. The introduction of an interface standard, the so called functional mock-up interface (FMI), is an enabler for this process to be deployed on a wider scale.

The used simulation models of physical systems are created in domain specific authoring tools. These tools are used for its fit for purpose numerical solvers. Because the physical systems mainly are modelled in continuous time domain, the resulting co-simulation models are in fact sampled systems. For this reason it is common knowledge to limit the bandwidth of the modeled system to fit well within the Nyquist frequency.

However, co-simulation of, for instance, mechanical systems have strongly coupled interfaces. In the particular case when motion signals are input, resulting forces and/or torques (or vice versa) have to be fed back. But, the applied motions (or forces and/or torques) create continuous time step responses which induce noise with a relatively large bandwidth.

EP2680157 addresses the above issues of a co-simulation system by computing a Jacobian matrix based on output derivatives, wherein the output derivatives are based on corresponding state variable derivatives related to corresponding first input variables for each of a plurality of subsystems. The method disclosed by EP2680157 also includes modifying the first input variables and computing second input variables and residuals for each of the plurality of subsystems based on corresponding state variable derivatives.

However, even though the suggested method of EP2680157 may solve some of the present problems related to co-simulation, the method described in EP2680157 would require complex mathematical procedures. Moreover, the method requires detailed knowledge of the properties of the subsystems, which is not always possible when connecting subsystems represented by different commercial tools.

Accordingly, there is a need for a simplified method of improving the connectivity between subsystems in a co-simulation system.

SUMMARY

In view of above-mentioned of the prior art, it is an object of the present disclosure to provide an improved method and system for control and co-simulation.

According to a first embodiment of the disclosure, there is provided a method for control and co-simulation in a system comprising a plurality of subsystems, each subsystem representing a physical system, wherein the method comprises; in a first subsystem simulating a first physical system, providing a first time continuous output signal representing a property of the first physical system; filtering the output signal using a continuous moving average (CMA) filter as an anti-aliasing filter to form a filtered time continuous signal; wherein filtering the output signal comprises: integrating the time continuous signal to form an integrated signal; sampling the integrated signal; for each sample, form an average value from the current sample $S_0$ and a previous sample $S_{0-n}$, where n>0, divided by the total sample time h*n, where h is the sample period; and forming a filtered time continuous signal from the average values; wherein the method further comprises providing the filtered time continuous signal to a second subsystem simulating a second physical system.

Through the above method, a control and co-simulation system is provided which conserves energy and which improves the overall stability of the system. In particular, the above discussed filter does not deteriorate the energy transfer over the interface between the first and the second subsystem.

According to one embodiment of the disclosure, the filter may advantageously form an average value for n=2, i.e. the average value being formed from the present sample $S_0$ and the sample $S_{-2}$. In other words, for a set of three consecutive samples, the first and the third sample is used to form an average over the entire time interval. This can be seen as a rolling window, so that a CMA-filter is formed. It has been found that a CMA filter as described above using n=2 provides the most advantageous properties. Using n=1 may cause gain problems and using n>2 may cause lag problems. In the case where n=1, the gain at zero frequency is 0 dB, but for the frequency range beyond 10% of the Nyquist frequency, the gain increases steadily. The overall system may be stable, but significant oscillations may be present. On the other hand in case of n>2 the bandwidth of the transferred signals over the interface will become unnecessarily low and deteriorate substantially from the results that would be obtained in a monolithic solution. For uneven values for n, signals up to the Nyquist frequency may be present, whereas for even n, the gain at the Nyquist frequency is 0. Accordingly, even though different values of n can be used, n=2 has been shown to be preferable.

According to one embodiment of the disclosure, the first time continuous output signal may represent a flow of the first subsystem.

In one embodiment of the disclosure, each of the plurality of subsystems may be characterized by a flow and an effort. The system with the largest impedance (inertia in the mechanical domain) at its port will determine the flow variable (velocity in the mechanical domain) and the port with the lowest impedance will determine the reaction effort (force/torque in the mechanical domain). Velocity is the rate of position change of the inertia. The different subsystems may for example represent a combustion engine connected to a controlled double clutch transmission. The overall system may also comprise subsystems representing a complete powertrain and driveline co-simulated with a complete chassis model for a vehicle.

According to one embodiment of the disclosure, the first subsystem may advantageously represent a first physical system having a higher impedance than the second physical system. In general, the system with higher impedance determines the flow (velocity in the mechanical domain) as the transferred signal over the interface between the first and the second subsystem, and the lower impedance system determines the effort (force/torque in the mechanical domain). The first subsystem may for example represent an engine and a second subsystem may represent a controller unit. The controller unit may for example be configured to control the engine.

According to one embodiment of the disclosure, the method may further comprise, in the second subsystem: receiving the filtered time continuous signal from the first subsystem; simulating a behavior of the second physical system based on the received signal; providing a second time continuous output signal representing a property of the second subsystem; filtering the second output signal using a continuous moving average filter as an anti-aliasing filter to form a second filtered time continuous signal; wherein filtering the output signal comprises: integrating the second time continuous signal to form an integrated signal; sampling the integrated signal; for each sample, form an average value from the current sample $S_0$ and a previous sample $S_{0-n}$, where n>0, divided by the total sample time h*n, where h is the sample period; and forming a second filtered time continuous signal from the average values; wherein the method further comprises providing the second filtered time continuous signal to the first subsystem.

In the same manner as described above for the first subsystem, the second system advantageously comprises the same type of CMA anti-aliasing filter, where the first and second subsystem are connected so that the second subsystem may send a filtered signal to the first subsystem.

According to one embodiment of the disclosure, if the first physical system has a higher impedance than the second physical system, the first output signal may represent a velocity and the second output signal represents a torque. As discussed above, the first subsystem with the higher impedance drives, i.e. determines the direction of flow in, the overall system by providing a signal representing the velocity of that subsystem to the second subsystem with the lower inertia. The second subsystem will then form an output signal representing torque to be provided to the first subsystem.

According to a second embodiment of the disclosure, there is provided a method for control and co-simulation in a system comprising a plurality of subsystems, each subsystem representing a physical system, wherein the method comprises; in a first subsystem simulating a first physical system, providing a first time discrete output signal representing a property of the first physical system, the first discrete output signal having a first sample rate; filtering the output signal using a continuous moving average filter as an anti-aliasing filter to form a filtered time continuous signal; wherein filtering the output signal comprises: summing the time discrete signal to form a summed signal; sampling the summed signal using a second sample rate lower than the first sample rate; for each sample, form an average value from the current sample $S_0$ and previous samples $S_{-1} \ldots S_{-(n+1)}$, where n>0, divided by the total number of samples n; and forming a filtered time discrete signal from the average values; wherein the method further comprises providing the filtered time continuous signal to a second subsystem simulating a second physical system.

The second embodiment of the disclosure relates to a co-simulation system where the subsystem provides a time discrete signal which is down-sampled by the filter using a lower sampling rate. This may for example be advantageous in the case of a subsystem having a sampling rate which is higher than what is possible to transfer between two subsystems.

The method of the second embodiment may also be applied for a continuous triggered signal. In general, sampling is commonly performed at constant sample periods. However, samples may also be taken based on a trigger event which not necessarily takes place at regular intervals. Accordingly, the triggering event for sampling first system may not take place at regular intervals.

In one embodiment of the disclosure, n may be equal to the ratio between the first sample rate and the second sample rate.

According to one embodiment of the disclosure, the first sampling rate may be a variable sampling rate.

Further effects and features of the second embodiment of the disclosure are largely analogous to those described above in connection with the first embodiment of the disclosure.

According to a third embodiment of the disclosure, there is provided control and co-simulation system comprising a plurality of subsystems, each subsystem representing a physical system, wherein the co-simulation system comprises: a first subsystem simulating a first physical system, configured to provide a time continuous output signal representing a velocity or a torque of the first physical system; an anti-aliasing filter connected to an output of the first subsystem and configured to form a filtered time continuous signal; wherein the anti-aliasing filter comprises: an integrator configured to integrate the time continuous signal to form an integrated signal; a sampling module configured to continuously sample the integrated signal; an averaging module configured to form an average value from the current sample $S_0$ and a previous sample $S_{0-n}$, where n>0, divided by the total sample time h*n, where h is the sample period; and wherein the control and co-simulation system further comprises an output module configured to form a time continuous output signal from the average values formed by the averaging module; and wherein the control and co-simulation system comprises a second subsystem simulating a second physical system, the second subsystem being connected to the anti-aliasing filter to receive the filtered time continuous signal. According to one embodiment of the disclosure, if the first physical system has a higher impedance than the second physical system, the first output signal may represent a flow and the second output signal may represent an effort, and if the first physical system has a lower impedance than the second physical system, the first output signal may represent an effort and the second output signal may represent a flow.

According to one embodiment of the disclosure, if the first physical system has a higher inertia than the second physical system, the first output signal may represent a velocity and the second output signal may represent a torque, and if the first physical system has a lower inertia than the second physical system, the first output signal may represent a torque and the second output signal may represent a velocity.

The system may also comprise a time discrete filter as described above in relation to the second embodiment of the disclosure. Additional effects and features of the second embodiment of the disclosure are largely analogous to those described above in connection with the first and second embodiments of the disclosure.

Further features of, and advantages with, the present disclosure will become apparent when studying the appended claims and the following description. The skilled person realizes that different features of the present disclosure may be combined to create embodiments other than those described in the following, without departing from the scope of the present disclosure.

BRIEF DESCRIPTION OF THE DRAWINGS

These and other embodiments of the present disclosure will now be described in more detail, with reference to the appended drawings showing an example embodiment of the disclosure, wherein.

DETAILED DESCRIPTION

As required, detailed embodiments are disclosed herein. However, it is to be understood that the disclosed embodiments are merely exemplary and that various alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

In the present detailed description, various embodiments of the system and method according to the present disclosure will be described.

Figure 1A:
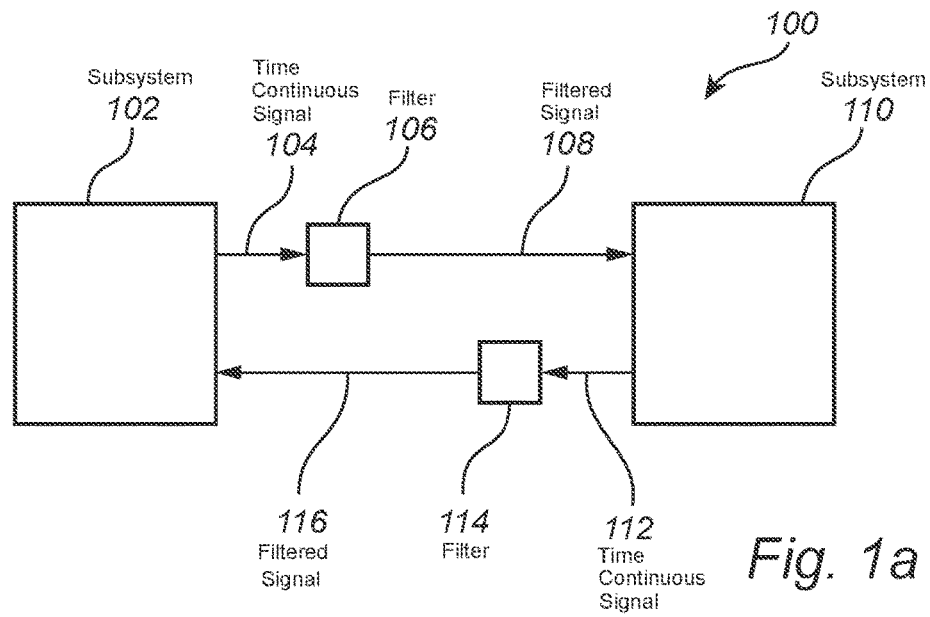
FIGS. 1a-b are schematic illustrations of a system and elements thereof according to an embodiment of the disclosure.

FIG. 1a is a schematic illustration of a co-simulation and control system 100 according to an embodiment of the disclosure. The system comprises a first subsystem 102 which provide a first time continuous signal 104 as output. The time continuous signal 104 is provided to a filter 106 in the form of a continuous moving average (CMA) filter acting as an anti-aliasing filter. The functionality of the filter will be further discussed below with reference to FIGS. 2-4. The system 100 further comprises a second subsystem 110 simulating a second physical system, the second subsystem 110 being connected to the anti-aliasing filter 106 to receive the filtered time continuous signal 108. Furthermore, the second subsystem 110 provides a time continuous output signal 112 to a second CMA antialiasing filter 114, similar to the first filter 106. Accordingly the second filter 114 provides a second filtered signal 116 to the first subsystem 102.

Figure 1B:
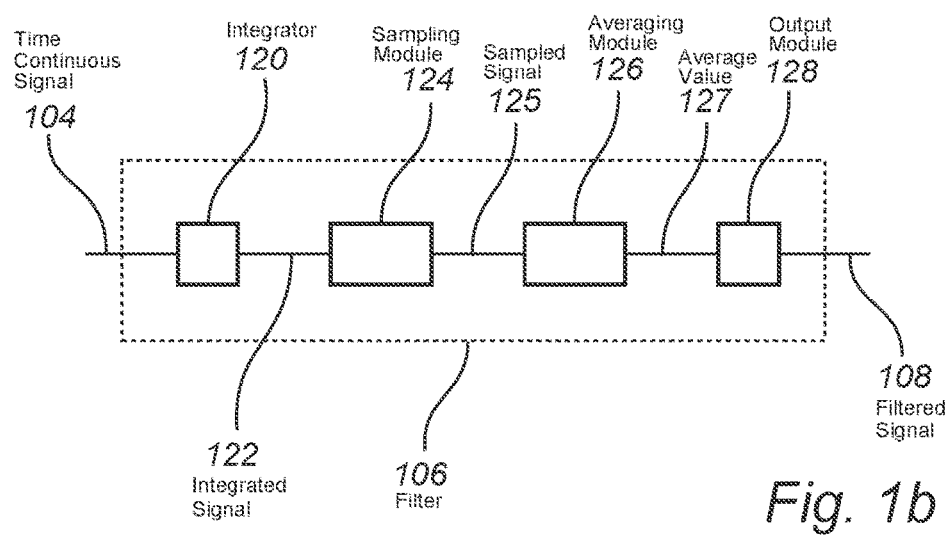

FIG. 1b is a schematic illustration of the filter 106 CMA anti-aliasing filter. The filter comprises an integrator 120 configured to integrate the time continuous signal 104 to form an integrated signal 122. The integrated signal is passed to a sampling module 124, or a sampling circuit, which is configured to continuously sample the integrated signal 122. The sampled signal 125 is then passed to an averaging module 126 configured to form an average value 127 from the current sample $S_0$ and a previous sample $S_{0-n}$, where n>0, divided by the total sample time h*n, where h is the sample period. The averaging module 126 is connected to an output module 128 which then provides the filtered time continuous signal 108.

The filter 106 for a time continuous input signal u can be mathematically described as $$y(z) = \frac{1-z^{-n}}{nh} \int u \, dt,$$

where n is the integer number, which may also be referred to as the filter order, h is the sample time, t is time and y is the time continuous output signal.

It should be noted that the system 100, first subsystem 102, second subsystem 110, and anti-aliasing filters 106 and 114, including integrator 120, sampling module 124, averaging module 126, output module 128, and any other system, subsystem, device or module described herein may individually, collectively, or in any combination comprise appropriate circuitry and/or one or more appropriately programmed processors (e.g., one or more microprocessors including central processing units (CPU)) and associated memory, which may include stored operating system software and/or application software executable by the processor(s) for controlling operation thereof and for performing the particular algorithms represented by the various functions and/or operations described herein, including interaction between and/or cooperation with each other. One or more of such processors, as well as other circuitry and/or hardware may be included in a single ASIC (Application-Specific Integrated Circuitry), or several processors and various circuitry and/or hardware may be distributed among several separate components, whether individually packaged or assembled into a SoC (System-on-a-Chip).

FIGS. 2-4 are graphs schematically illustrating examples of the different signals according to embodiments of the disclosure. It should be noted that the graphs are not drawn to scale, and that the y-axis notation merely illustrate the sign of the signal.

Figure 5:
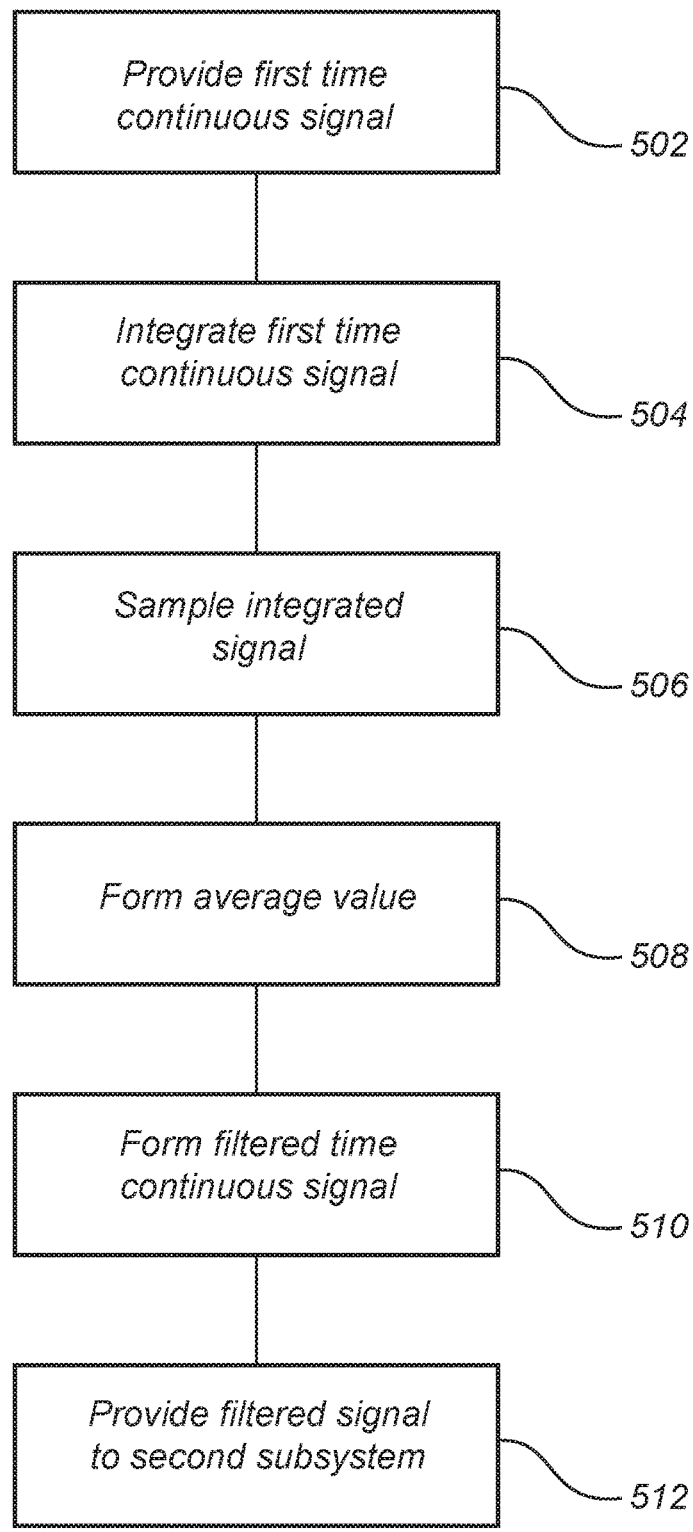
FIG. 5 is a flow chart outlining the general steps of a method according to an embodiment of the disclosure.

The graphs of FIGS. 2a-e will be discussed with reference to the flow chart of FIG. 5 outlining the general steps of a method according to an embodiment of the disclosure for a subsystem providing a time continuous output signal.

Figure 2A:
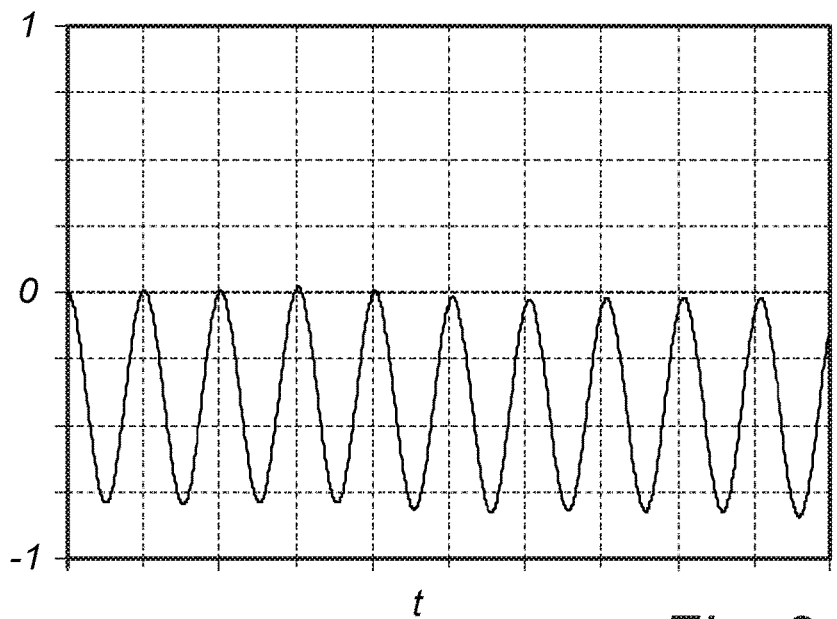
FIGS. 2a-e are graphs schematically outlining the function of a filter according of embodiments of the disclosure.
Figure 2B:
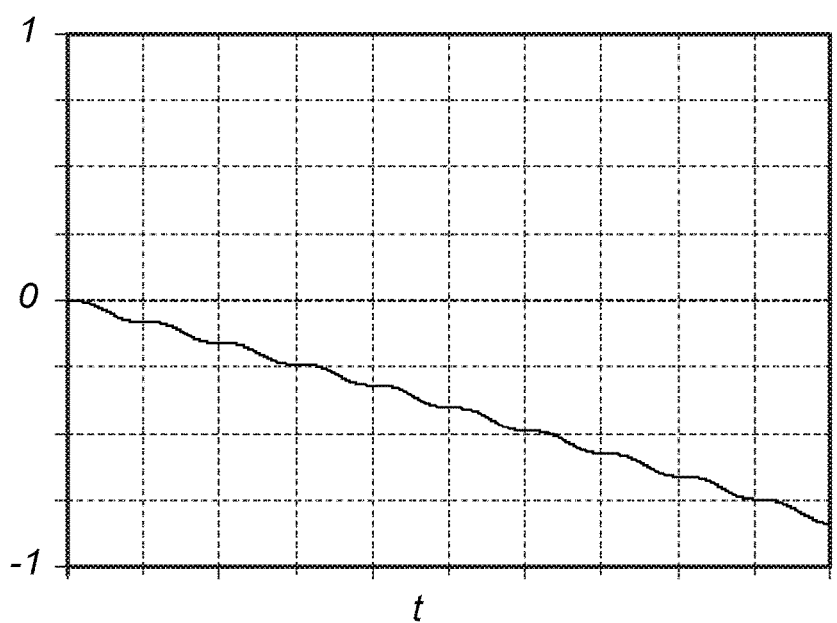
Figure 2C:
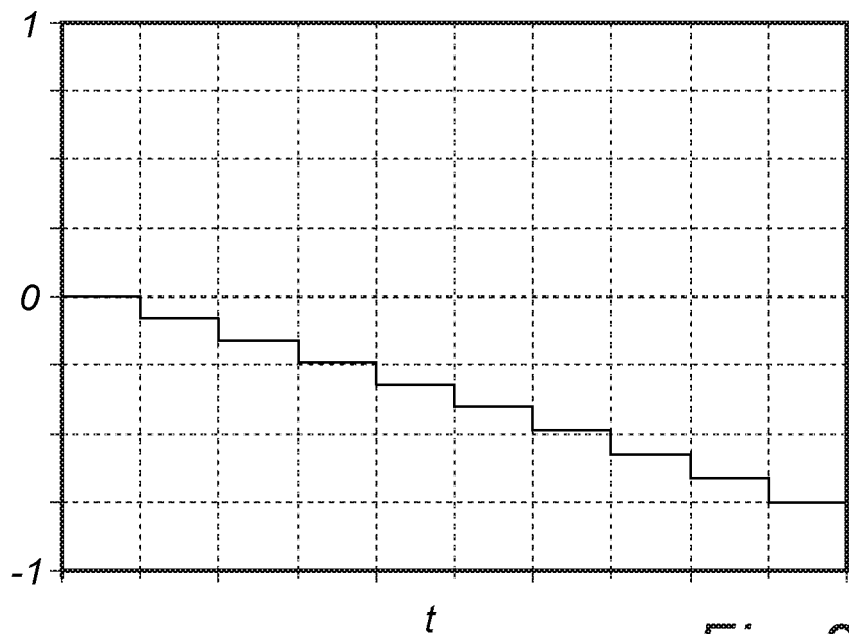
Figure 2D:
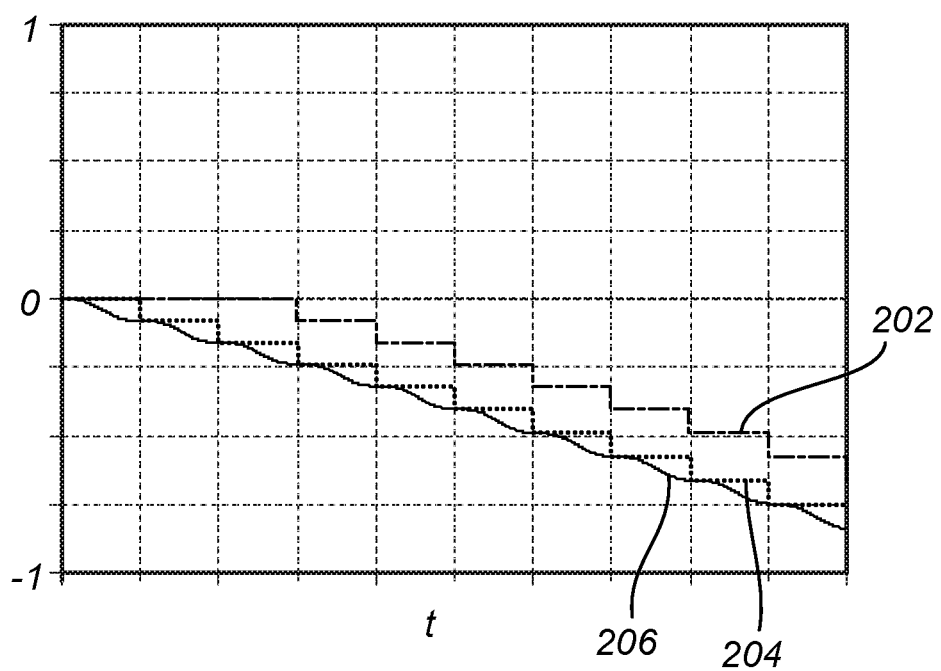

First, in step 502, a first time continuous signal 104 is provided by the first subsystem 102, here in the form of a sinusoidal signal as illustrated in FIG. 2a. FIG. 2b illustrates the integrated time continuous signal 122, which is the result of the time continuous signal 104 being passed through the integrator 120 according to step 504. Next 506, the integrated time continuous signal 122 is sampled by the sampling module 124 to form a sampled signal as shown in FIG. 2c. The sample times are represented by the stepwise changes of the signal. FIG. 2d illustrates the time shifted sampled signal used to form the average value according to step 506. The time shifted signal is illustrated for n=2, 202 (dashed) along with the sampled signal 204 (dotted) of FIG. 2c and the integrated signal 206 (solid) illustrated in FIG. 2b is also shown.

The filtering function for n=2 can in principle be described as $$y(z) = \frac{z^0 - z^{-2}}{2h} \int u\,dt$$

and in step 508 the average value for n=2 is formed from the current sample $S_0$ and a previous sample $S_{-2}$ divided by the total sample time 2h, where h is the sample period.

Figure 2E:
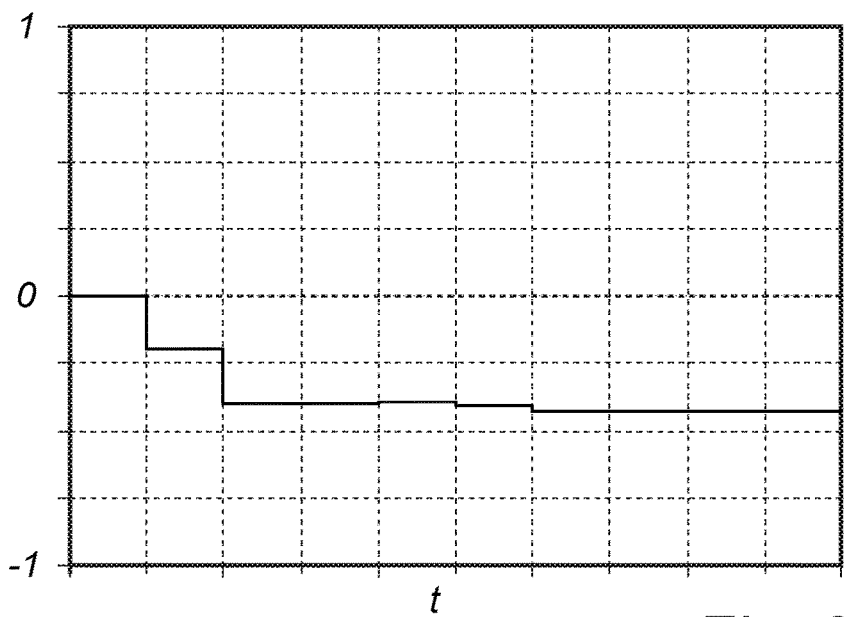

FIG. 2e illustrates the final filtered time continuous signal 108 for n=2 according to step 510. In the final step 512, the filtered time continuous signal 108 is provided to the second subsystem 110.

It should be noted that the signal 108 is referred to as time continuous even though the signal only changes value in a discrete manner at regular times, according to the sampling rate used. The signal 108 is referred to as time continuous since it is a signal in the time continuous domain to be used as an input signal to a subsystem requiring a time continuous signal as input signal, thus it can be seen as time continuous.

Figure 6:
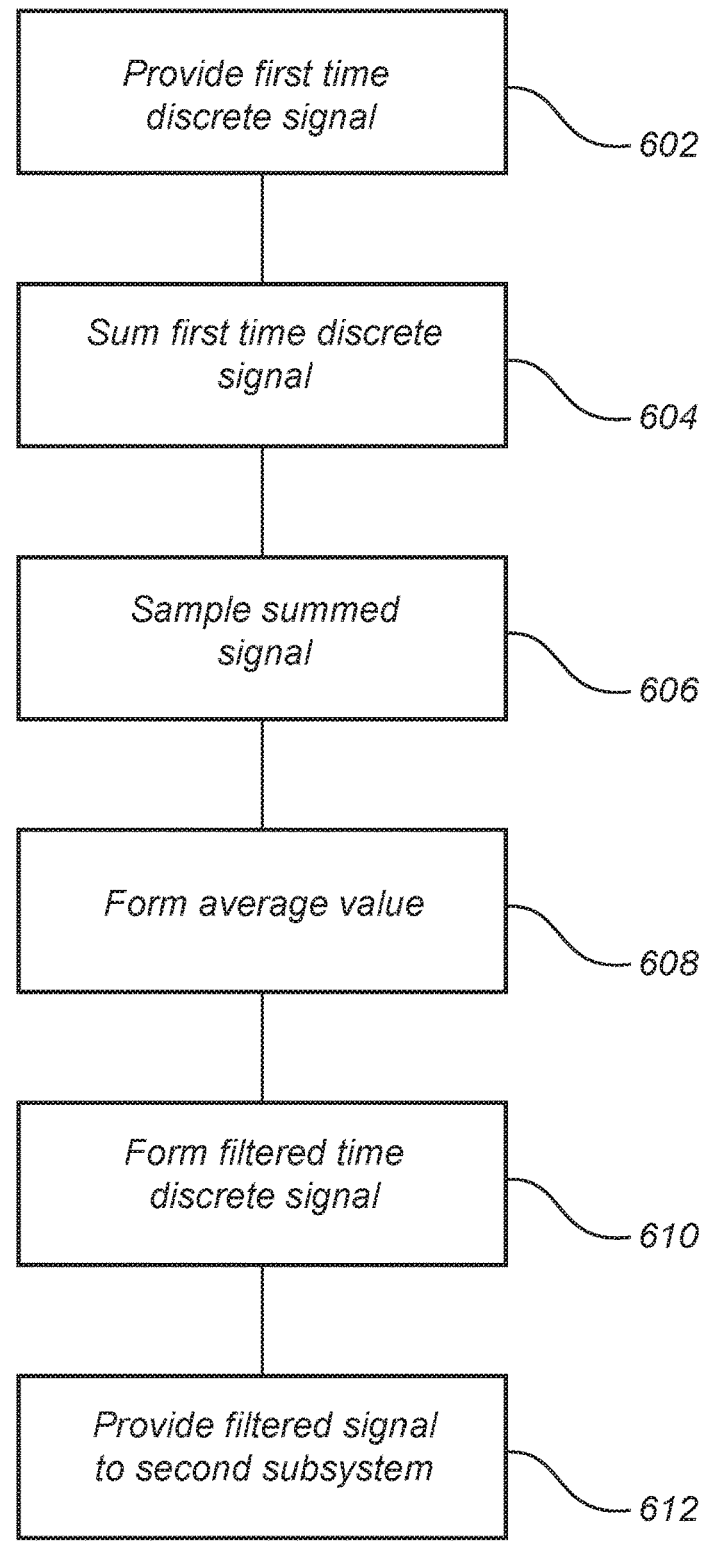
FIG. 6 is a flow chart outlining the general steps of a method according to an embodiment of the disclosure.

According to one embodiment of the disclosure, the subsystem may provide a time discrete signal as output signal. This will be described in the following with reference to the graphs of FIGS. 3a-d and the flow chart of FIG. 6.

A filter for a time discrete input signal can be mathematically described as $$y(z_n) = \frac{1}{n}\sum_{i=0}^{n-1} z^{-i} u',$$

where u' is the time discrete input signal, n is an integer number, which may also be referred to as the filter order and y is the time discrete output signal. The use of the above filter can be seen as a case where a physical system or physical systems are modelled and simulated with a fixed step integrator.

Figure 3A:
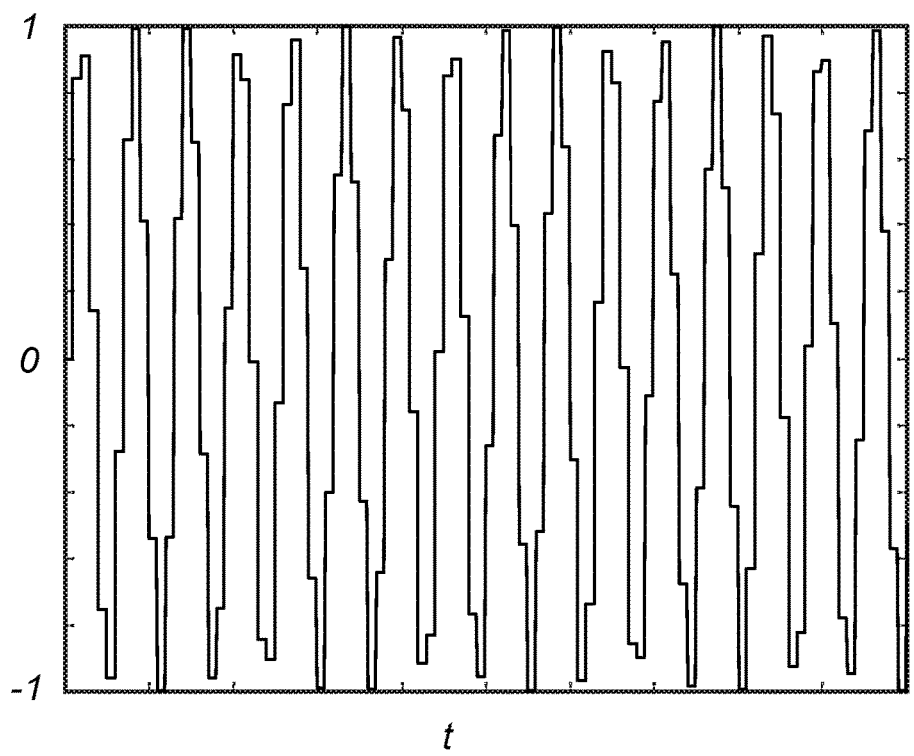
FIGS. 3a-d are graphs schematically outlining the function of a filter according of embodiments of the disclosure.
Figure 3B:
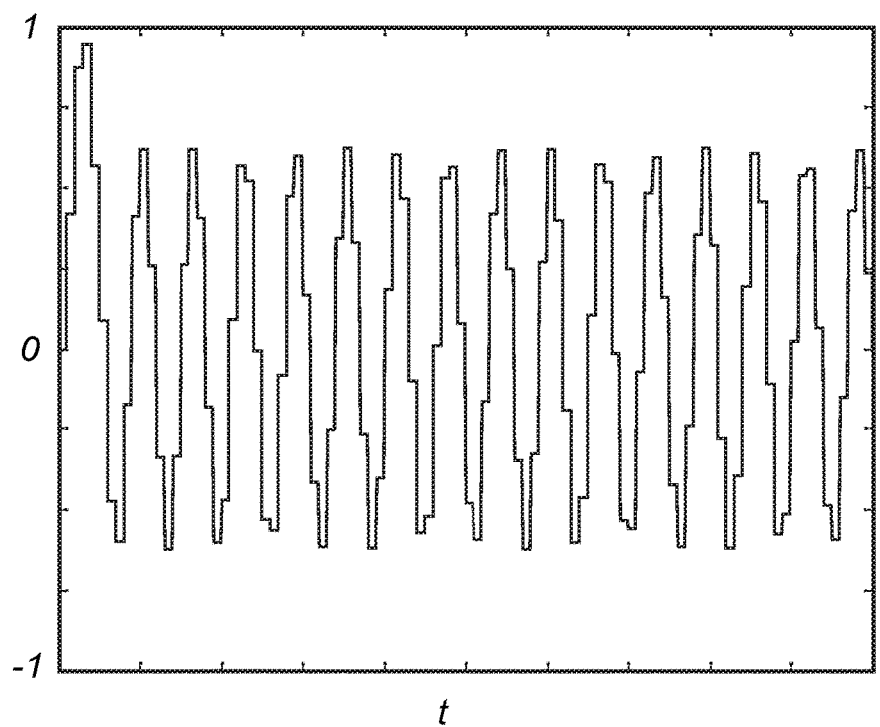
Figure 3C:
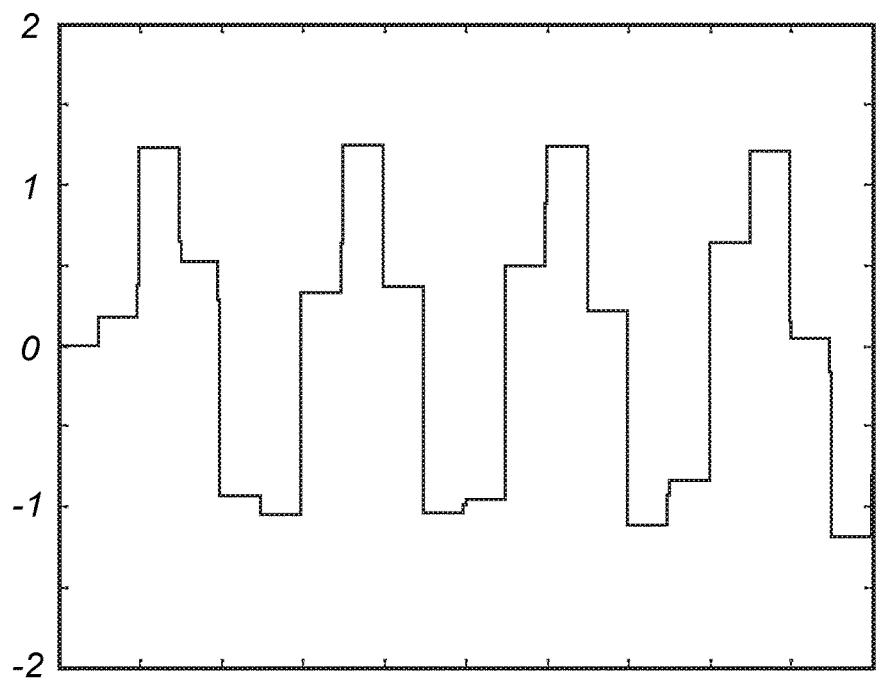

First, in step 602, a first time discrete signal having a first sampling rate, illustrated in FIG. 3a, is provided by the first subsystem. FIG. 3b illustrates the summed time discrete signal according to step 604. Next, in step 606, the summed time discrete signal is down-sampled using a second sampling rate which is lower than the first sampling rate of the first time discrete signal. The resulting down-sampled signal is illustrated in FIG. 3c.

Figure 3D:
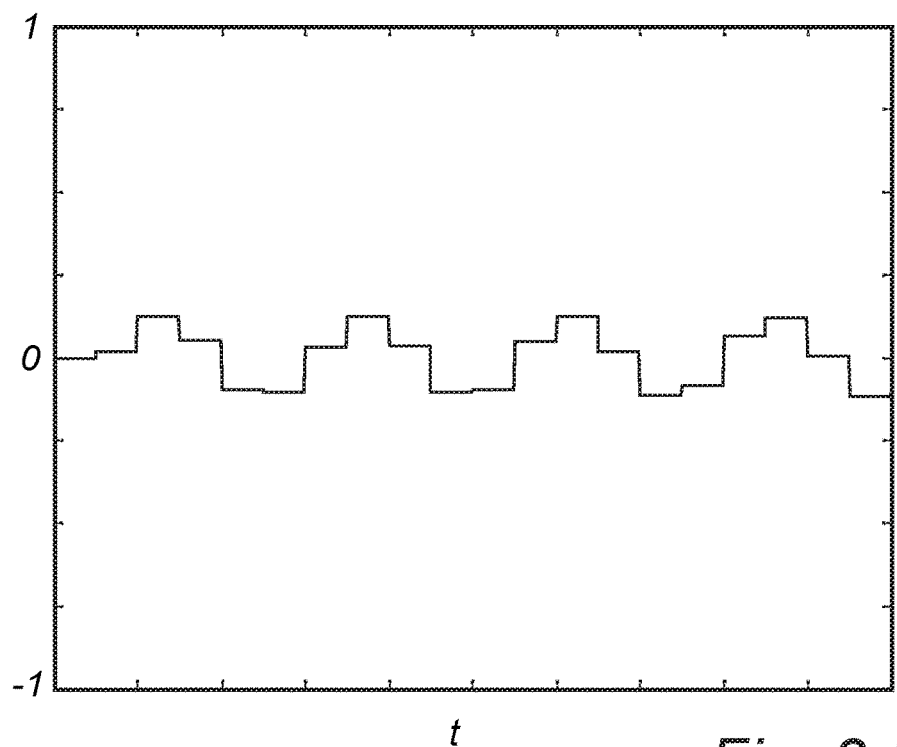

In the following step 608 an averaged value is formed based on the down sampled signal by forming an average value from the current sample $S_0$ and a previous sample $S_{0-n}$, divided by the total number of samples h in the range $S_0$ to $S_{0-n}$. Subsequently, in step 610, an averaged signal is formed from the average values as illustrated in FIG. 3d. In the present description, n is an integer equal to the ratio between the first sampling rate and the second sampling rate. In the final step 612, the filtered signal is provided to the second subsystem.

In the description above, the summed time discrete signal is first down-sampled and after that it is averaged. However, it should be noted that it is equally possible to first average the signal followed by down-sampling, and that this may be advantageous in some applications. For example, in specific implementations of the method it may be advantageous to perform the averaging step prior to the down-sampling step, although the two different sequenced are mathematically equivalent yielding the same end result.

Figure 4A:
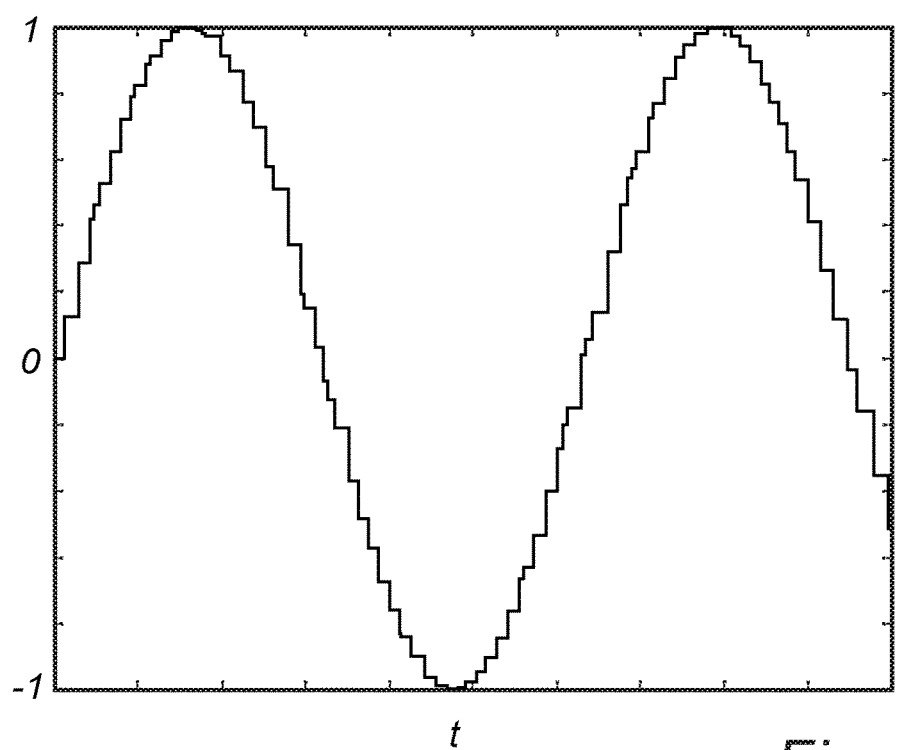
FIGS. 4a-d are graphs schematically outlining the function of a filter according of embodiments of the disclosure.
Figure 4B:
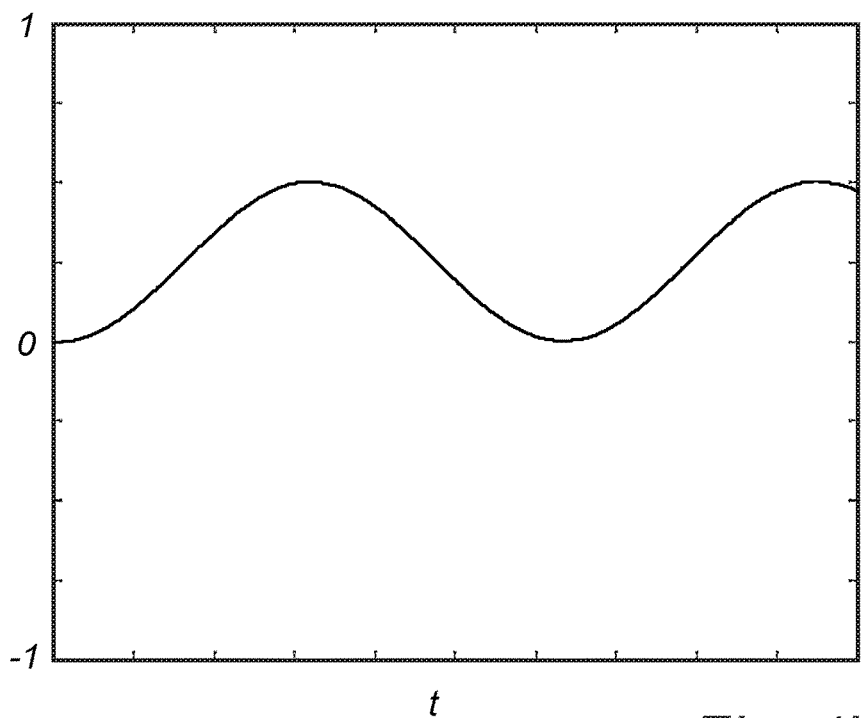

The graphs of FIGS. 4a-d schematically illustrate an example of a method where the first subsystem produces a continuous sampled (triggered) signal as illustrated in FIG. 4a. Moreover, the sample frequency (sampling period) of the signal in FIG. 4a is not constant. Instead, it varies within a predetermined range, or between a predetermined number of sampling frequencies. The sampled signal is integrated (not summed) during the sample period to form the time continuous signal illustrated in FIG. 4b.

Figure 4C:
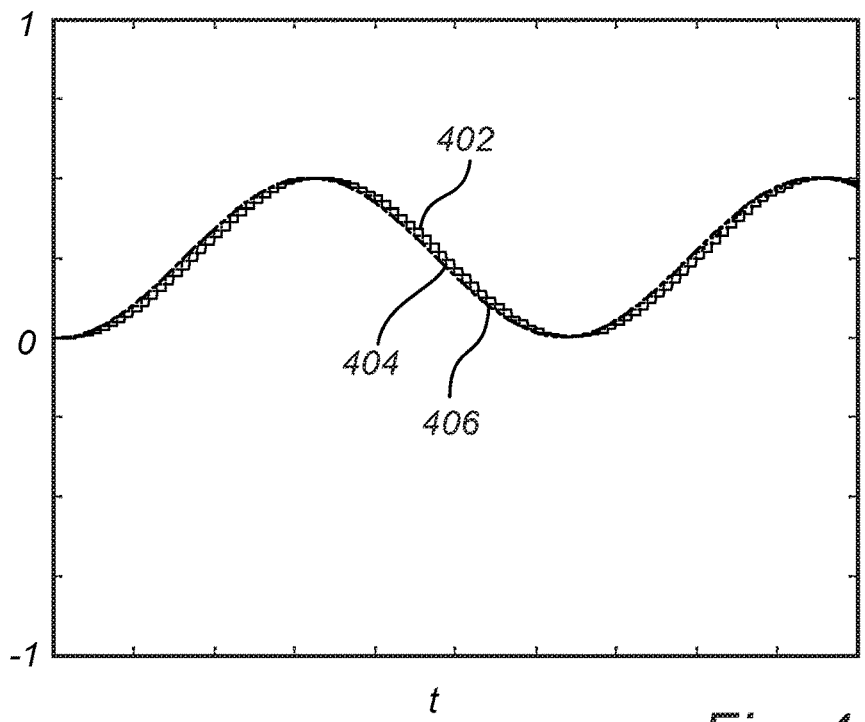
Figure 4D:
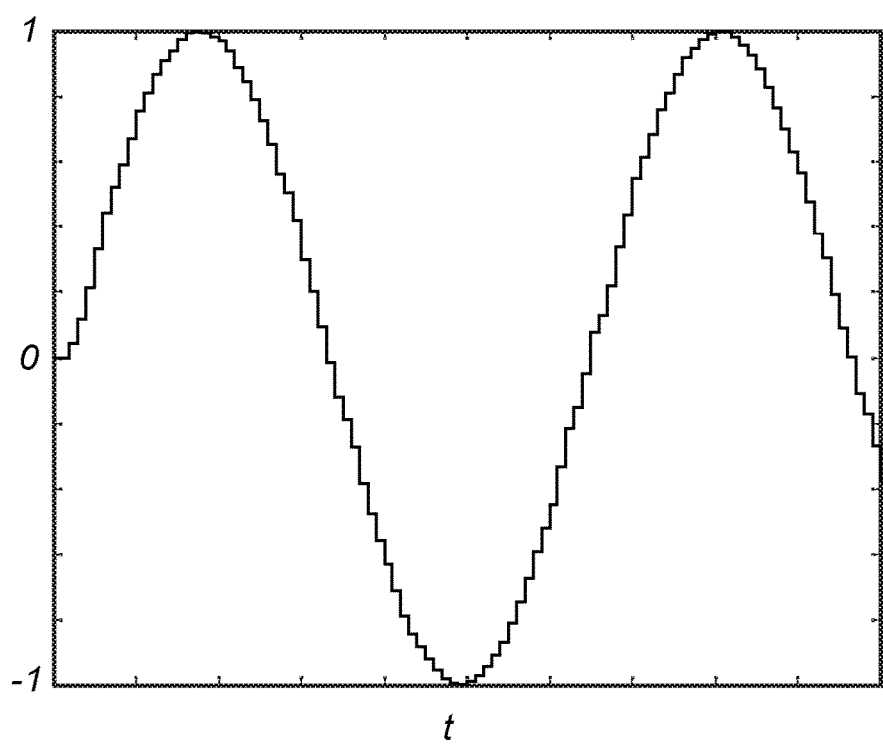

Next, the time continuous signal, illustrated as 406 in FIG. 4c, is sampled to give the signal 404 and an averaging signal is formed based on the sampled signal 404 and a time shifted signal 402 in a manner similar to what is described above in relation to FIGS. 3a-d. Also here, the average value may advantageously be derived as the average taken over two sample periods. The resulting averaged signal to be provided to the second subsystem is illustrated in FIG. 4d.

Even though the disclosure has been described with reference to specific exemplifying embodiments thereof, many different alterations, modifications and the like will become apparent for those skilled in the art. Also, it should be noted that parts of the method and system may be omitted, interchanged or arranged in various ways, the system and method yet being able to perform the functionality of the present disclosure. In particular, it should be noted that the steps of the method may be performed in a different sequence compared to what is described above, while still providing the same resulting output signal.

Additionally, variations to the disclosed embodiments can be understood and effected by the skilled person in practicing the claimed disclosure, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments of the disclosure.

What is claimed is:

1. A method performed by a processor for control and co-simulation in a system comprising a plurality of subsystems, each subsystem representing a physical system, the method comprising:
   in a first subsystem simulating a first physical system, providing a first time continuous output signal representing a property of the first physical system;
   filtering the output signal using a continuous moving average filter as an anti-aliasing filter to form a filtered time continuous signal, wherein filtering the output signal comprises;
      integrating the time continuous signal to form an integrated signal,
      sampling the integrated signal,
      for each sample, forming an average value from the current sample $S_0$ and a previous sample $S_{0-n}$, where n>0, divided by total sample time h*n, where h is sample period, and
      forming a filtered time continuous signal from the average values; and
   providing the filtered time continuous signal to a second subsystem simulating a second physical system.

2. The method according to claim 1 wherein n=2.

3. The method according to claim 1 wherein the first time continuous output signal represents a flow of the first subsystem.

4. The method according to claim 1 wherein each of the plurality of subsystems is characterized by a flow and an effort.

5. The method according to claim 1 wherein the first subsystem represents a first physical system having a higher impedance than the second physical system.

6. The method according to claim 1 further comprising, in the second subsystem:
receiving the filtered time continuous signal from the first subsystem;
simulating a behavior of the second physical system based on the received signal;
providing a second time continuous output signal representing a property of the second subsystem;
filtering the second output signal using a continuous moving average filter as an anti-aliasing filter to form a second filtered time continuous signal; wherein filtering the output signal comprises:
integrating the second time continuous signal to form an integrated signal;
sampling the integrated signal;
for each sample, forming an average value from the current sample $S_0$ and a previous sample $S_{0-n}$, where n>0, divided by the total sample time h*n, where h is the sample period;
forming a second filtered time continuous signal from the average values; and
providing the second filtered time continuous signal to the first subsystem.

7. The method according to claim 6 wherein, if the first physical system has a higher impedance than the second physical system, the first output signal represents a flow and the second output signal represents an effort.

8. The method according to claim 6 wherein, if the first physical system has a lower impedance than the second physical system, the first output signal represents an effort and the second output signal represents a flow.

9. A method performed by a processor for control and co-simulation in a system comprising a plurality of subsystems, each subsystem representing a physical system, the method comprising:
in a first subsystem simulating a first physical system, providing a first time discrete output signal representing a property of the first physical system, the first discrete output signal having a first sample rate;
filtering the output signal using a continuous moving average filter as an anti-aliasing filter to form a filtered time continuous signal, wherein filtering the output signal comprises
summing the time discrete signal to form a summed signal,
sampling the summed signal using a second sample rate lower than the first sample rate,
for each sample, forming an average value from the current sample $S_0$ and previous samples $S_{-1}$ . . . $S_{-(n+1)}$, where n>0, divided by total number of samples n, and
forming a filtered time discrete signal from the average values; and
providing the filtered time continuous signal to a second subsystem simulating a second physical system.

10. The method according to claim 9 wherein n is equal to the ratio between the first sample rate and the second sample rate.

11. The method according to claim 10 wherein the first sampling rate is a variable sampling rate.

12. A control and co-simulation system comprising a plurality of subsystems, each subsystem representing a physical system, the co-simulation system implemented in a processor and comprising:
a first subsystem simulating a first physical system and configured to provide a time continuous output signal representing a velocity or a torque of the first physical system;
an anti-aliasing filter connectable to an output of the first subsystem and configured to form a filtered time continuous signal, wherein the anti-aliasing filter comprises:
an integrator configured to integrate the time continuous signal to form an integrated signal,
a sampling module configured to continuously sample the integrated signal, and
an averaging module configured to form an average value for each sample from the current sample $S_0$ and a previous sample $S_{0-n}$, where n>0, divided by total sample time h*n, where h is sample period;
an output module configured to form a time continuous output signal from the average values formed by the averaging module; and
a second subsystem simulating a second physical system, the second subsystem connectable to the anti-aliasing filter to receive the filtered time continuous signal.

13. The system according to claim 12 wherein, if the first physical system has a higher impedance than the second physical system, the first output signal represents a flow and the second output signal represents an effort, and if the first physical system has a lower impedance than the second physical system, the first output signal represents an effort and the second output signal represents a flow.

14. The system according to claim 12 wherein, if the first physical system has a higher inertia than the second physical system, the first output signal represents a velocity and the second output signal represents a torque, and if the first physical system has a lower inertia than the second physical system, the first output signal represents a torque and the second output signal represents a velocity.

* * * * *